United States Patent [19]

Suchet et al.

[11] Patent Number: 5,358,878
[45] Date of Patent: Oct. 25, 1994

[54] METHOD OF MANUFACTURING AN INTEGRATED HIGH ELECTRON MOBILITY TRANSISTOR HAVING A SURROUNDING INSULATING LAYER

[75] Inventors: Philippe Suchet, Vincennes; Jean-Jacques Vingrief, Yerres, both of France

[73] Assignee: U.S. Philips Corporation, New York, N.Y.

[21] Appl. No.: 848,615

[22] Filed: Mar. 9, 1992

[30] Foreign Application Priority Data

Mar. 15, 1991 [FR] France ................ 91 03198

[51] Int. Cl.$^5$ ............................ H01L 21/265
[52] U.S. Cl. ........................ 437/40; 437/96; 437/184; 437/912
[58] Field of Search ............ 257/631, 632, 194; 437/409, 49, 50, 96, 104, 133, 947, 981, 912, 184

[56] References Cited

U.S. PATENT DOCUMENTS 4,545,109 10/1985 Reichert ................ 29/571
4,663,643 5/1987 Mimura ................ 257/631

OTHER PUBLICATIONS

GAAS IC. Symposium Tech. Digest, Oct. 1989, pp. 143-146 "Low Temp. Buffer AlInAs/GaInA5 on InP HEMT Technology for Ultra-High-Speed Integrated Cir.".

Primary Examiner—Olik Chaudhuri
Assistant Examiner—H. Jey Tsai
Attorney, Agent, or Firm—Steven R. Biren

[57] ABSTRACT

A method of realizing an integrated circuit on a substrate (10) includes steps for forming a high electron mobility transistor (HEMT), including the realization of a superimposed structure (11) of layers on the substrate, among which are present at least a first layer (31) or channel of a material with a narrow bandgap and weakly doped, a second layer (22) or spacer of a material of wider bandgap and weakly doped, and a third layer (23) or donor of a material of wide bandgap and strongly doped, which layers are covered by a fourth layer (24) or Schottky layer, and the realization of an insulating zone completely surrounding the transistor relative to the other elements of the integrated circuit. For realizing the insulation, the method includes the formation at the surface of the superimposed layer structure of a mask (M) covering and defining the active zone of the transistor, etching of the superimposed layer structure down to the substrate (10) with underetching under the mask (M), so as to insulate the active zone by means of a mesa, the realization of a dielectric layer (K) by anisotropic deposition, directional etching of the dielectric layer (K) while the portions of this layer (K) protected by the mask (M) are maintained as a result of the under-etching and disposed on the flanks of the mesa around the active zone of the transistor, and removal of the mask (M).

6 Claims, 3 Drawing Sheets

METHOD OF MANUFACTURING AN INTEGRATED HIGH ELECTRON MOBILITY TRANSISTOR HAVING A SURROUNDING INSULATING LAYER

BACKGROUND OF THE INVENTION

The invention relates to a method of manufacturing an integrated circuit on a substrate, which method comprises steps for forming a high electron mobility transistor (HEMT), these steps including the realization of a succession of layers provided on the substrate, among which are at least a layer of a material having a narrow bandgap which is weakly doped for forming the channel of the transistor and a donor layer of a material having a wide bandgap which is strongly doped for providing electrons, these steps also including the realization of an insulation zone completely surrounding the transistor relative to the other elements of the integrated circuit and the realization of gate, source and drain electrodes.

The invention has its application in the manufacture of digital or analog integrated circuits.

A process as described above is known from the publication by April S. Brown et al. of the Hughes Research Laboratories, entitled "Low-Temperature Buffer AlInAs/GaInAs on InP HEMT Technology for Ultra-High-Speed Integrated Circuits", published in "1989 IEEE GaAs Ic Symposium", pp. 143–146.

The cited document describes a process for realizing an integrated circuit including the formation of a high electron mobility transistor. This process comprises the realization on a substrate of semi-insulating InP of a succession of layers, in that order: a buffer layer of AlInAs $n^-$, a channel layer of GaInAs $n^-$, a separating layer of AlInAs $n^-$, a donor layer of AlInAs $n^+$, (strongly doped), a layer suitable for receiving a Schottky contact and made of AlInAs $n^-$, and an encapsulating layer of GaInAs.

After the layers have been formed, two contacts of the ohmic type are realized for forming the source and drain of the transistor at the surface of the encapsulating layer. Then a groove is etched between the source and the drain down to the said Schottky layer and a Schottky-type contact is realized by means of a metallization in this groove so as to form the gate of the transistor by self-alignment.

The cited document teaches that two techniques are possible for insulating the transistor from other elements of the integrated circuit.

The first method indicated is insulation by the formation of a mesa, i.e. by the realization of an etched portion completely surrounding the transistor region, which etched portion delimits the transistor whose active region accordingly is present in relief relative to the substrate. In these conditions it is necessary for the metallization of the Schottky gate to follow the flank of the mesa for connecting the gate to a gate contact pad disposed in the vicinity of the transistor in the region of the substrate which appears after etching of the mesa, as is shown in FIG. 3 of the cited document.

This arrangement of the connection between the gate metallization and its contact pad leads to a serious problem, for the connection metallization is in contact with all the layers which reach up to the flank of the mesa, particularly the strongly doped AlInAs $n^+$ layer, so that during operation the transistor suffers from a strong leakage current, as is shown in FIG. 2 of the cited document.

According to this document, this leakage current is avoided in that the transistor is insulated not by the formation of a mesa but by a second method comprising an implantation of ions around the active zone, which results in the device remaining planar.

The second solution indicated, however, is not favored by those skilled in the art of manufacturing integrated circuits. In fact, ion implantation for the realization of insulation requires burdensome technical means consisting of an ion implantation device; moreover, it requires a heat treatment which tends to deteriorate the characteristics of the layers or of other devices of the integrated circuit already realized; furthermore, ion implantation is not fully reproducible; in addition, its effectivity is less than that of a mesa. All these facts mean that firstly the useful manufacturing output of integrated circuits with the inclusion of the steps for insulating by ion implantation may be severely limited instead of reaching figures as figures as close as possible to 100%, as is the target for the manufacturer of integrated circuits, and secondly that the cost of the integrated circuit is high.

Those skilled in the art thus find themselves confronted with the problem of how to avoid the ion implantation steps, and consequently of how to form the insulating mesa. This then involves the double problem
  of realizing a transistor without leakage currents, and
  of realizing this transistor without increasing the number of steps in the manufacturing process.

In fact, each increase in the number of steps can result in an accumulation of disadvantages: i.e. the manufacturing cost is increased while at the same time the useful manufacturing output is reduced, which in its turn further increases the ultimate manufacturing cost.

Given the present competitive situation among manufacturers of integrated circuits, the least increase in cost can result in a total loss of the market. It is thus of the greatest possible importance to minimize these costs. That which may seem at first sight to be only a detail in the manufacturing process, or, still at first sight, an equivalent step, may turn out to be a factor of economic disaster for the manufacturer of integrated circuits, or alternatively a means of maintaining his position on the market, as the case may be.

SUMMARY OF THE INVENTION

According to the invention, therefore, a manufacturing method as described in the opening paragraph is proposed which is in addition characterized in that it also comprises the steps of:
  providing a mask at the surface of the superimposed layers, which mask covers and defines the active zone of the transistor;
  etching the superimposed layer structure down to the substrate with underetching under the mask so as to insulate the active zone by means of a mesa;
  realizing a dielectric layer by uniform deposition;
  etching the dielectric layer directionally while maintaining the portions of this layer which are protected by the mask as a result of the under-etching and are disposed on the flanks of the mesa around the active zone of the transistor; and
  eliminating the mask.

According to the process, the insulation of the transistor is effected by the formation of the mesa, which avoids all the disadvantages involved in ion implantation, and which provides the desired advantages of:

- insulation of the gate connection from the strongly doped layer as well as from the other layers thanks to the dielectric layer, resulting in the reduction of leakage currents to the same extent as in the known process;
- improvement of the other performance characteristics of the transistor compared with those of the known transistor owing to a better insulation of this transistor from the other components realized on the substrate;
- an increase in the useful manufacturing output owing to a smaller dispersion of characteristics of the components caused by a better insulation of each transistor and by the simplicity of the manufacturing process; and
- reduction on the one hand of the cost of the equipment necessary for realizing the integrated circuits, since it is not necessary to provide an ion implantation device, and on the other hand of the manufacturing cost itself because of the high useful manufacturing output and the simplicity of the process.

BRIEF DESCRIPTION OF THE DRAWING

The invention is described in detail below with reference to the drawing, in which.

DESCRIPTION OF THE PREFERRED EMBODIMENT

The invention relates to an advantageous process for realizing a high electron mobility transistor (HEMT) in manufacturing synergy with other elements of an integrated circuit. The characteristics of the HEMT per se are well known to those skilled in the art of manufacturing integrated circuits, both digital and analog, in all technologies, and will accordingly not be described further here.

The present transistor comprises a layer structure realized on a substrate, among which are present at least a first layer 31 of a material having a narrow bandgap which is weakly doped so as to form a channel of the transistor, a second layer 22 of a material having a wider bandgap which is weakly doped so that it can form a two-dimensional electron gas at the interface with the said first layer 31 and so that it can spatially separate the electrons of this two-dimensional gas from the charges of the following layer, and a third layer 23 of a material having a wide bandgap which is strongly doped for providing electrons which can be transferred in the two-dimensional gas.

These layers are covered by a fourth layer 24 with which a contact of the Schottky type is realized so as to form the gate G of the transistor.

The transistor is in addition provided with means for insulating it from other elements of the integrated circuit realized on the same substrate. According to the invention, these insulating means comprise the realization of a mesa and not an implantation of ions which is considered costly and disadvantageous in the industry which manufactures integrated circuits.

It is an object of the invention to provide a process for realizing such a HEMT which is free from leakage currents which would appear in the transistor during its operation if, owing to the mesa, the gate metallization G should come into contact with the strongly doped layer forming part of the active region and reaching up to the flanks of the mesa. Another object of the invention is to provide such a process suitable for being carried out without replacing the known expensive ion implantation step by other steps which are equally expensive in order to achieve the said object, such as, for example, one or several supplementary masking steps (a masking step being considered expensive because it includes sub-steps of defining an optical mask, which is always costly, followed by carrying out a photolithographic operation).

Figure 1:
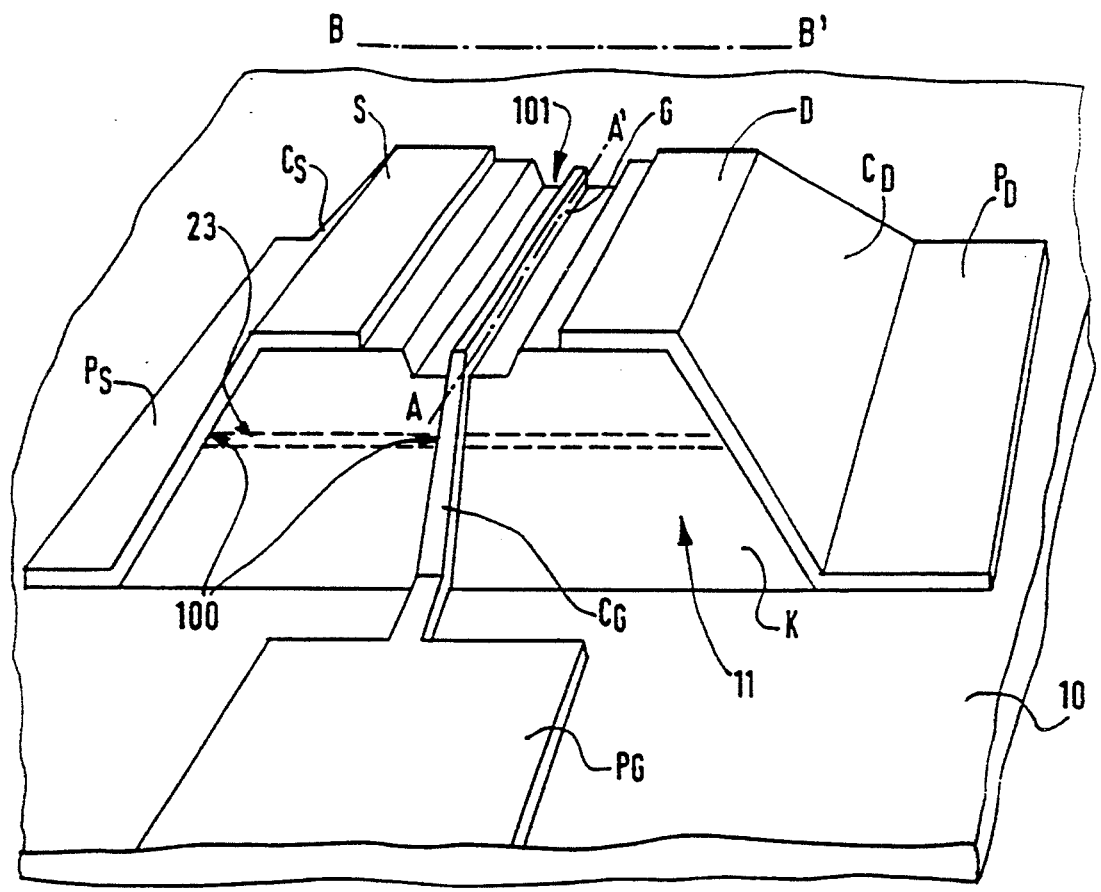
FIG. 1 shows a HEMT realized on a substrate in perspective view.

FIG. 1 is a simplified perspective view of a HEMT obtained by the process according to the invention.

This transistor comprises a superimposed structure 11 of several semiconductor layers provided on a substrate 10. It comprises in addition, at the surface of these layers referred to as active layers, a source electrode S, a gate electrode G, and a drain electrode D, respectively. The raised structure is called a mesa. The source, gate, and drain electrodes are connected by means of metal connections $C_S$, $C_G$ and $C_D$, to source, gate, and drain contact pads $P_S$, $P_G$, and $P_D$, respectively, arranged around the mesa on the substrate 10 in the non-active regions.

It is favorable in this case for the substrate 10 to be semi-insulating.

The metal connections $C_S$, $C_G$ and $C_D$ are accordingly disposed along the flanks 100 of the mesa. To avoid contact between these connections, and particularly contact between the gate connection $C_G$ and the strongly doped layer, for example 23, along the flanks 100 of the mesa, these flanks 100 are provided with a dielectric layer K, which provides electrical insulation, during the steps in which the mesa is realized, without lengthening the manufacturing process of the integrated circuit in which the HEMT is included or increasing its cost.

This process is described below with reference to FIGS. 2a to 2g whereby the HEMT is provided on a semi-insulating substrate made of InP (indium phosphide). The composition and thickness of the layers are given purely by way of example; in fact, the process according to the invention may be applied to numerous other cases in which an insulated component is formed by means of a mesa.

As referenced in FIGS. 2a to 2g, the process preferably comprises the following succession of steps:

a) the formation (see FIG. 2a) of active layers of the transistor by epitaxial growth on the surface of a semi-insulating substrate 10, which is advantageously made of InP. The layers advantageously have the compositions and thicknesses as given in Table I in connection with their reference numerals from the FIGS. 2. Starting from the substrate, we find successively in that order a layer 21 of AlInAs (aluminum-indium arsenide) serving as a buffer and weakly doped with the type $n^-$, for example merely having a residual doping resulting from the growth, i.e. not intentionally doped; a layer 31 of GaInAs (gallium-indium arsenide) forming the channel, for example not intentionally doped; a layer 22 of AlInAs (aluminum-indium arsenide) serving as a spacer layer, for example not intentionally doped; a layer 23 of AlInAs (aluminum-indium arsenide) strongly doped with the type n+, for example with species such as Si; a layer 24 of AlInAs (aluminum-indium arsenide) or Schottky layer, for example not intentionally doped, by which the contact with the gate electrode G is realized; and at the surface a layer 32 or encapsulating layer (CAP layer) of GaInAs (gallium-indium arsenide) strongly doped with the type n+ to reduce the contact resistances, at the surface of which the ohmic contacts S and D are formed so as to provide the source and drain electrodes of the transistor. In this system of layers, the material GaInAs for realizing the channel layer 31 has a narrow bandgap, while the material AlInAs for realizing the spacer layer 22 and the strongly doped layer 23 which is to act as a donor have wider bandgaps. Under these conditions, a two-dimensional electron gas establishes itself at the interface of the layers 31 and 22. Such a system realized in InP is known as a "super HEMT" because at present it provides better performance characteristics than other HEMTs which have long been known to those skilled in the art and are realized on GaAs. In fact, in super HEMTs, the difference between the bandgaps of the heterojunction materials is greater.

The invention, however, may also be applied to the realization of HEMTs on GaAs.

In that case, the transistor comprises at least on the substrate the layer 31 forming the channel, not intentionally doped and having a narrow bandgap, and the donor layer 23 which has a wide bandgap and is strongly doped for providing charge carriers.

Figure 2A:
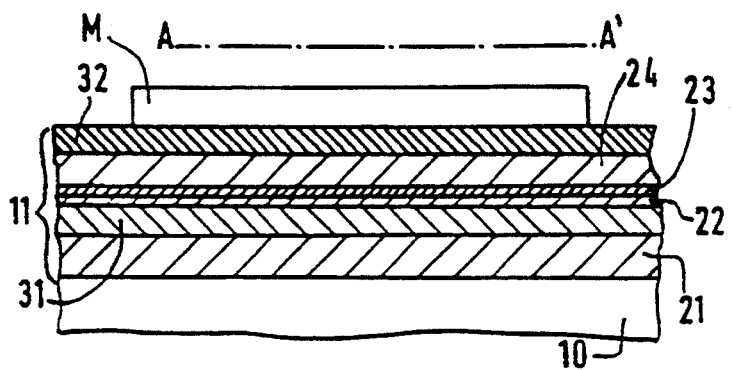
FIGS. 2a-2g illustrate in a simplified manner the various steps in the process of realizing the insulation of the transistor and the metallization of the gate in cross-section taken on the line AA' in FIG. 1.
Figure 2B:
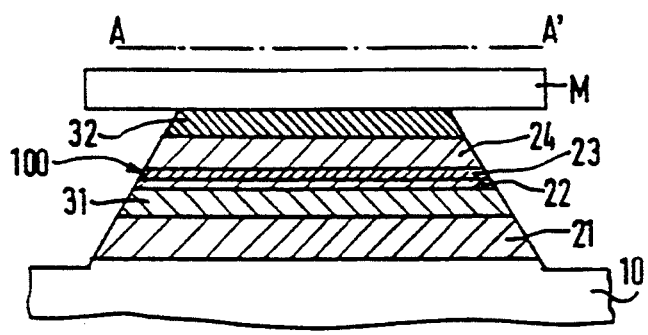
Figure 2C:
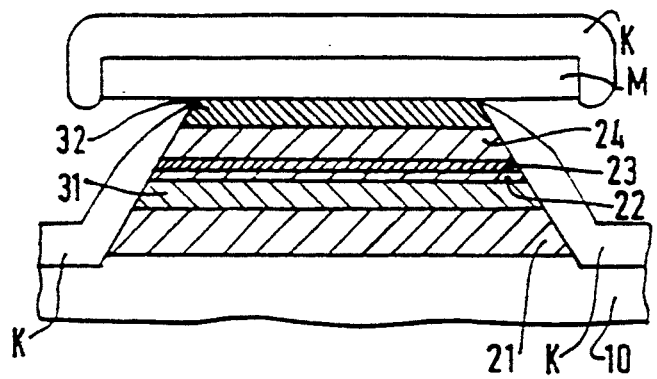
Figure 2D:
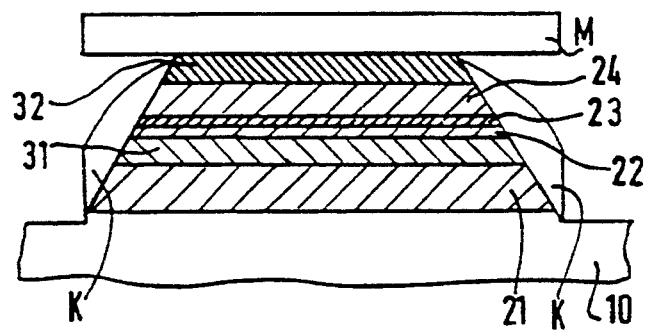
Figure 2E:
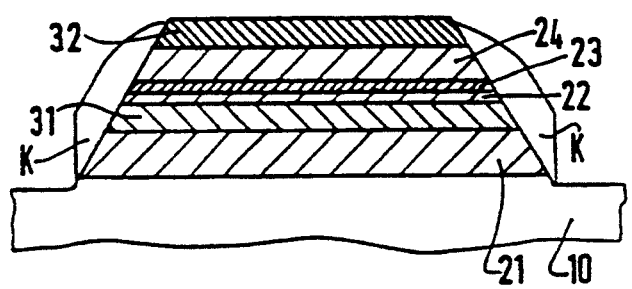

The process for realizing the epitaxial layers will advantageously be a technique known to those skilled in the art, such as MBE or MOCVD;

b) the formation (FIG. 2a) of a mask M, for example of photoresist, covering and defining the active zone of the future transistor at the surface of the superimposed structure 11;

c) etching of the superimposed structure 11 (see FIG. 2b) down to the substrate 10, with underetching under the mask M so as to form the flanks 100 of the mesa, which flanks show an inclination owing to the underetching. This type of etching will advantageously be realized by means of a wet etching process in a mixture of $H_3PO_4$, $H_2O_2$, $H_2O$ in respective ratios of 3:1:20. Underetching is to be understood to mean that the top of the mesa is narrower than the mask M;

d) the realization (see FIG. 2c) by uniform deposition of a layer K of a good dielectric. A good dielectric is to be understood to mean any dielectric which is generally used for insulating the various metal levels in an integrated circuit from one another. For example, $Si_3N_4$ (silicon nitride) or $SiO_2$ (silica) may be chosen. Uniform deposition is to be understood to mean the deposition of a substantially uniform thickness over nearly all the regions of the transistor: active layers forming the mesa, mask M and substrate around the transistor, as shown in FIG. 2c where layer K is of substantially uniform thickness everywhere except the upper corners of the mesa;

e) a directional etching, i.e. RIE (Reactive Ion Etching), so as to eliminate the dielectric layer K on the mask M and on the substrate (see FIG. 2d). This isotropic etching is highly directional, perpendicular to the substrate, so that the dielectric layer K is maintained in the regions protected by the mask M, i.e. especially on the flanks 100 of the mesa. This effect is obtained through selective elimination of the dielectric layer K without attacking the masking layer M. In the case in which M is a photoresist and K is $Si_3N_4$, the attacking gases for carrying out the RIE will advantageously be the mixture $SF_6$–$CHF_6$;

f) finally, elimination of the photoresist mask M by any means known to those skilled in the art. The result of this step is shown in FIG. 2e.

Figure 2F:
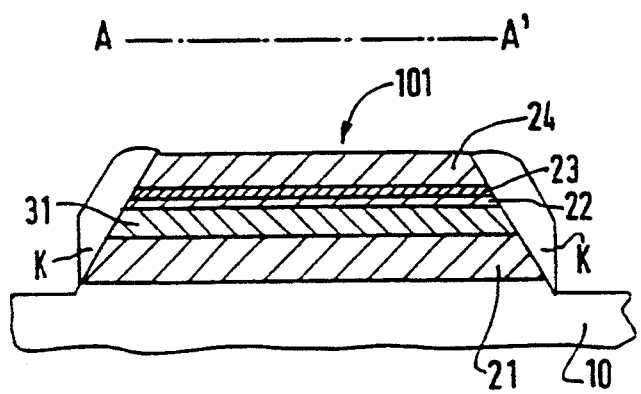
Figure 2G:
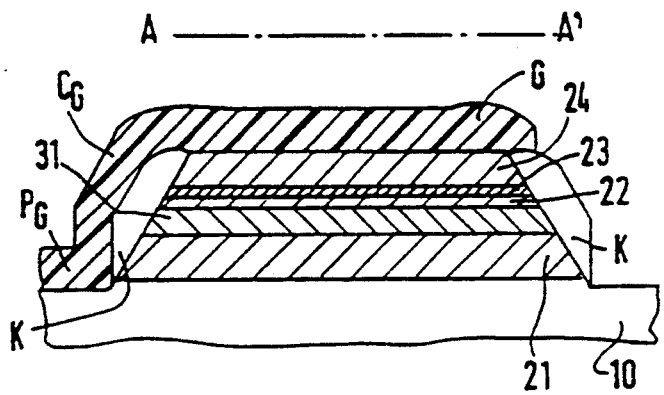
Figure 3:
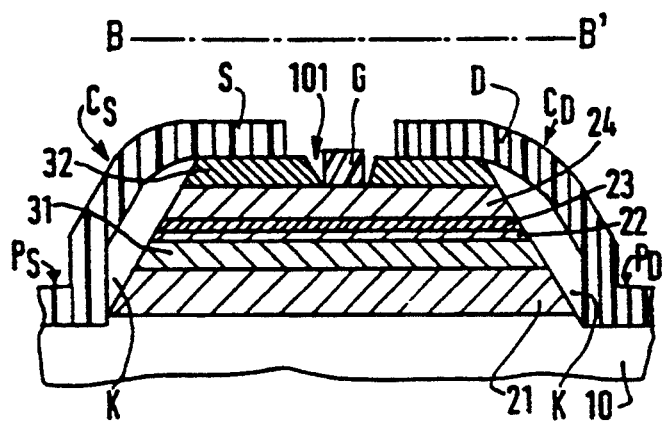
FIG. 3 shows a simplified cross-section taken on the line BB' in FIG. 1.

The process further comprises conventional steps known to those skilled in the art:

g) the formation of ohmic contacts S and D and of connections $C_S$ and $C_D$ at the surface of the dielectric K on the flanks 100 of the mesa, and of the pads $P_S$ and $P_D$ (see FIG. 3);

h) the formation of a groove 101 or gate opening for exposing the Schottky layer 24 by a suitable etching into the encapsulating layer 32 (see FIG. 2f in cross-section taken on the line AA', and FIG. 3 taken on the line BB');

i) the formation (see FIGS. 2g and 3) of the gate metallization G of the Schottky type in the groove, as well as of the connection $C_G$ at the surface of the dielectric K, and of the pad $P_G$.

The advantages of this process are:
- the step of realizing the mask M defining the active zone of the transistor is equivalent to that of a mask defining the insulating region by ion implantation according to the prior art;
- the wet etching step for forming the mesa is inexpensive compared with the ion implantation step according to the prior art. The mesa forms a much more effective insulation of the transistor;
- the heat treatment step belonging to the implantation is avoided;
- the deposition of silicon nitride $Si_3N_4$ or of silica $SiO_2$ may be carried out jointly with the protection of other regions of the integrated circuit, so this step does not lengthen the process;
- the RIE step does not require any special mask since the mask M defining the active region, which is already present, is used.

Tests carried out on the HEMT obtained by the method according to the invention show that the leakage current of the transistor operating under the same conditions as that according to the cited prior art is equally small, that is judging from the text of the cited document rather than from the Figure displayed, whose scale does not render it possible to appreciate realistically the value of the reverse leakage current of the transistor constructed as a diode. In the transistor obtained by the method according to the invention, this leakage current may be considered to be zero. On the other hand, the performance characteristics of the transistor according to the invention are improved compared with those of the known transistor.

In Table I, the indication of the indium concentration in the material refers to the preferred indium concentration in the ternary material for obtaining lattice matching with the InP substrate.

The metal used for realizing the Schottky contact of the gate G will advantageously be the allow TiPtAu. The metallization of the ohmic contacts of the source S and drain D will advantageously be obtained by deposition of AuGe/Ni/Au.

The buffer layer 21 may, if so desired in an alternative embodiment, be replaced by a superlattice in the realization of the superimposed layer structure 11.

TABLE I

| layer no. | function | material | indium concentration | doping level | thickness in nm | preferred thickness in nm |
|---|---|---|---|---|---|---|
| 32 | encapsulation | GaInAs | 53% | $10^{18}$ to $10^{19}$ | 5 to 20 | 5 to 10 |
| 24 | Schottky | AlInAs | 52% | not doped | 10 to 40 | 22 |
| 23 | donor | AlInAs | 52% | $10^{18}$ | 10 to 40 | 11 |
| 22 | spacer | AlInAs | 52% | not doped | 1 to 5 | 3 to 4 |
| 31 | channel | GaInAs | 53% | not doped | 20 to 80 | 60 |
| 21 | buffer | AlInAs | 52% | not doped | 50 to 500 | 75 to 100 |
| 10 | substrate | InP | | semi-insulating | | |

We claim:

1. A method of manufacturing an integrated circuit on a substrate (10), which method comprises steps for forming a high electron mobility transistor (HEMT), these steps including:

forming a superimposed structure (11) of layers on the substrate, among which are at least a layer (31) of a semiconductor material having a narrower bandgap which is lighter doped for forming a channel of the transistor, and a donor layer (23) of a semiconductor material having a wider bandgap which is heavier doped for providing electrons;

forming an insulation zone as a dielectric layer (K) completely surrounding the HEMT relative to the other elements of the integrated circuit; and forming gate, source and drain electrodes, characterized in that, forming the insulation zone as a dielectric layer (K) comprises the steps of:

forming a mask (M) at the surface of the superimposed structure of layers, which mask covers and defines an active zone of the transistor;

etching the superimposed structure of layers isotropically down to the substrate (10) with underetching under the mask (M) so as to shape the active zone in the form of a mesa;

forming a dielectric layer (K) on said mask, flanks of said mesa, and said substrate by uniform deposition;

etching the dielectric layer (K) directionally while maintaining the portions of this layer (K) which are protected by the mask as a result of the underetching and are disposed on the flanks of the mesa around the active zone of the transistor; and removing the mask (M).

2. A method as claimed in claim 1, characterized in that, during the forming of the superimposed layer structure (11), a lighter doped layer (22) of a material having a wider bandgap than the channel layer (31) is formed between said channel layer and the donor layer (23), so that a two-dimensional electron gas can be formed at the interface with said channel layer and the electrons of this two-dimensional gas are spatially separated from the charges of the following doped layer (23), and in that a layer of undoper material (24) having a wider bandgap is formed at the surface of the donor layer (23) for receiving a gate metallization (G) of the Schottky type.

3. A method as claimed in claim 2, characterized in that during the step of forming the superimposed layer structure (11), a buffer layer (21) of a material having the widest bandgap is provided between the substrate (10) and the first layer (31), and in that a higher doped encapsulating layer (32) of a material having the narrowest bandgap is provided at the surface of the fourth layer (24) for receiving the source and drain contacts.

4. A method as claimed in claim 3, characterized in that, for forming the contact electrodes, it comprises:

forming ohmic source and drain contacts on the encapsulating layer (32) and forming source and drain connections $C_S$ and $C_D$ on the dielectric (K) on the flanks of the mesa; then forming a groove (101), which serves as a gate opening, by etching of the encapsulating layer (32); and then forming the Schottky-type gate metallization in the groove and forming a gate connection $C_G$ on the dielectric (K) on a flank of the mesa.

5. A method as claimed in claim 3, characterized in that the substrate comprises indium phosphide (InP), the material having the narrowest bandgap comprises a gallium-indium arsenide (GaInAs), and the material having the widest bandgap comprises aluminum-indium arsenide (AlInAs).

6. A method as claimed in claim 1, characterized in that the material of the dielectric layer (K) for the insulation of the mesa is one of silica ($SiO_2$) and silicon nitride ($Si_3N_4$).

* * * * *